US012632353B2

(12) United States Patent
Penza et al.

(10) Patent No.: US 12,632,353 B2
(45) Date of Patent: May 19, 2026

(54) VIRTUAL TESTING OF DATA STORAGE DEVICES AND COMPONENTS THEREOF

(71) Applicant: Western Digital Technologies, Inc., San Jose, CA (US)

(72) Inventors: Donald Penza, Rochester, MN (US); Natasa Letourneaut, Rochester, MN (US); Vish Vuggumudi, Karnataka (IN)

(73) Assignee: Western Digital Technologies, Inc., San Jose, CA (US)

( * ) Notice: Subject to any disclaimer, the term of this patent is extended or adjusted under 35 U.S.C. 154(b) by 37 days.

(21) Appl. No.: 18/751,118

(22) Filed: Jun. 21, 2024

(65) Prior Publication Data

US 2025/0390404 A1     Dec. 25, 2025

(51) Int. Cl.
 *G06F 30/27* (2020.01)
 *G06F 11/26* (2006.01)
 G06F 3/06 (2006.01)

(52) U.S. Cl.
 CPC .......... *G06F 11/261* (2013.01); *G06F 3/0664* (2013.01); *G06F 30/27* (2020.01)

(58) Field of Classification Search
 CPC ........ G06F 11/261; G06F 30/17; G06F 30/20; G06F 30/27; G06F 3/0664
 See application file for complete search history.

(56) References Cited

U.S. PATENT DOCUMENTS

| | | | | |
|---|---|---|---|---|
| 5,640,286 A * | 6/1997 | Acosta | ............... | G11B 27/3027 360/48 |
| 6,714,368 B1 * | 3/2004 | Himle | ................... | G11B 27/36 360/48 |
| 7,031,902 B1 * | 4/2006 | Catiller | ................... | G06F 30/20 703/24 |
| 7,165,201 B2 * | 1/2007 | Groz | .................... | G06F 11/261 714/E11.167 |
| 7,756,648 B1 | 7/2010 | Vaidyanathan et al. | | |
| 10,699,795 B1 * | 6/2020 | Card | ....................... | G06F 30/32 |
| 11,592,989 B1 * | 2/2023 | Gupta | ................... | G06F 3/0664 |
| 2003/0081342 A1 * | 5/2003 | Hsin | .................. | G11B 5/59622 360/77.02 |
| 2006/0074970 A1 * | 4/2006 | Narayanan | .......... | G06F 11/3476 707/999.102 |

(Continued)

FOREIGN PATENT DOCUMENTS

CN 116691674 A * 9/2023 ............ B60W 30/16

*Primary Examiner* — Joseph O Schell
(74) *Attorney, Agent, or Firm* — Barry IP Law, P.C.

(57) ABSTRACT

A Data Storage Device (DSD) is represented by an embedding for virtual testing. A plurality of metrics is obtained for components of the DSD and is encoded into the embedding using a first Artificial Intelligence (AI) model. The embedding is provided as an input to a second AI model configured for virtual testing based on one or more simulated DSD workloads. In one aspect, virtual testing is performed for at least one DSD component by obtaining at least one metric for the at least one component for encoding into an embedding representing a virtual DSD including the at least one component. In another aspect, the embedding is provided to a DSD operator for virtual testing. In yet another aspect, the second AI model simulates at least one workload of the DSD operator or for one or more quality assurance tests of a DSD manufacturer.

20 Claims, 4 Drawing Sheets

(56)  References Cited

U.S. PATENT DOCUMENTS

| 2006/0217950 | A1* | 9/2006 | Heybruck | G06F 30/20 |
| | | | | 703/21 |
| 2016/0357895 | A1* | 12/2016 | Hyde | G06N 7/01 |
| 2018/0197574 | A1* | 7/2018 | Guo | G06F 11/00 |
| 2023/0079183 | A1* | 3/2023 | Bansal | G06F 12/1466 |
| | | | | 711/154 |
| 2023/0128173 | A1* | 4/2023 | Sha | G06F 11/3628 |
| | | | | 703/21 |
| 2023/0305734 | A1* | 9/2023 | Korotky-Adamenko | |
| | | | | G06F 30/3308 |
| 2024/0193439 | A1* | 6/2024 | Mukherjee | G06N 5/022 |

* cited by examiner

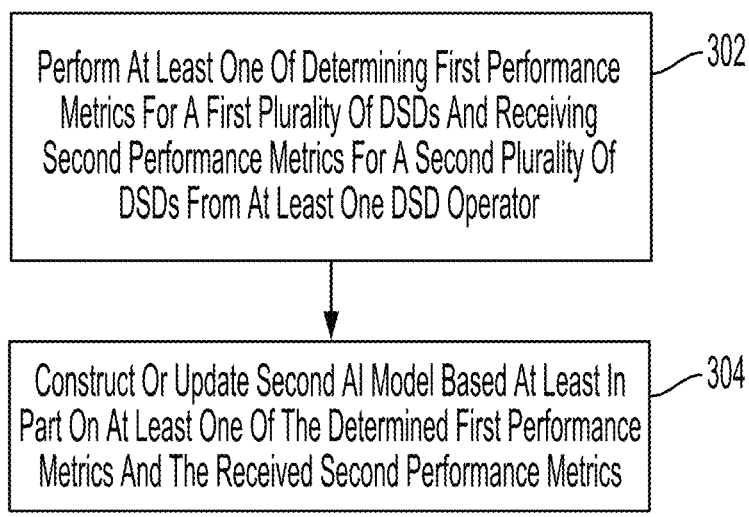

Perform At Least One Of Determining First Performance Metrics For A First Plurality Of DSDs And Receiving Second Performance Metrics For A Second Plurality Of DSDs From At Least One DSD Operator ⟋302

Construct Or Update Second AI Model Based At Least In Part On At Least One Of The Determined First Performance Metrics And The Received Second Performance Metrics ⟋304

FIG. 3

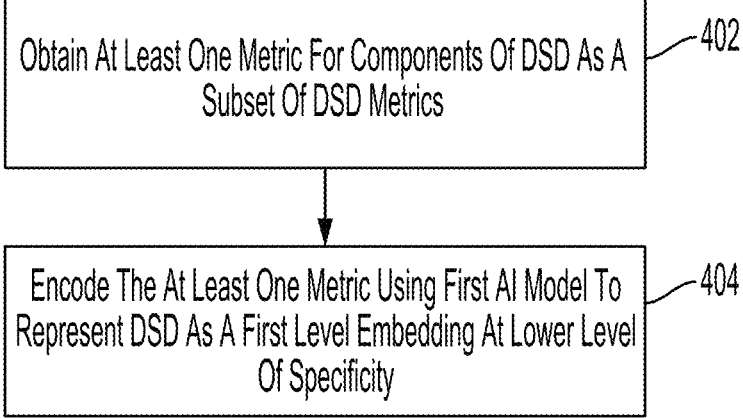

Obtain At Least One Metric For Components Of DSD As A Subset Of DSD Metrics ⟋402

Encode The At Least One Metric Using First AI Model To Represent DSD As A First Level Embedding At Lower Level Of Specificity ⟋404

FIG. 4

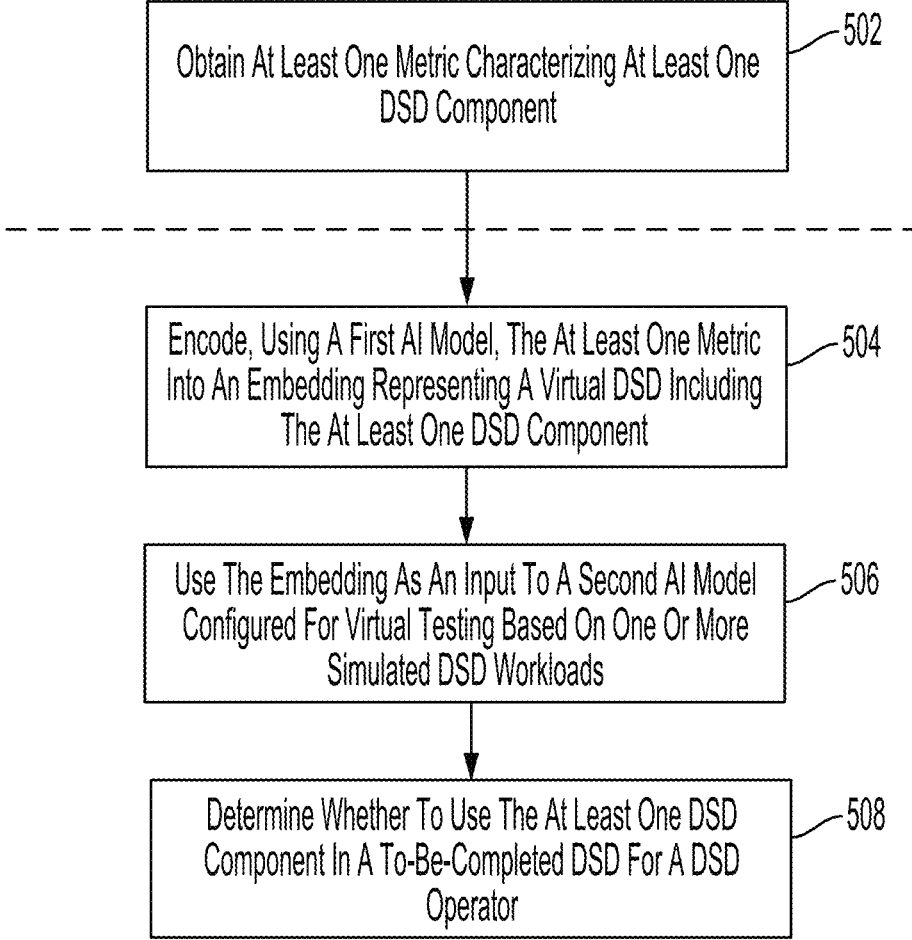

Obtain At Least One Metric Characterizing At Least One DSD Component ⏤502

Encode, Using A First AI Model, The At Least One Metric Into An Embedding Representing A Virtual DSD Including The At Least One DSD Component ⏤504

Use The Embedding As An Input To A Second AI Model Configured For Virtual Testing Based On One Or More Simulated DSD Workloads ⏤506

Determine Whether To Use The At Least One DSD Component In A To-Be-Completed DSD For A DSD Operator ⏤508

FIG. 5

VIRTUAL TESTING OF DATA STORAGE DEVICES AND COMPONENTS THEREOF

BACKGROUND

Ongoing Reliability Testing (ORT) may be performed by manufacturers of electronic devices, such as manufacturers of Data Storage Devices (DSDs), to detect problems or other issues with the electronic devices. For ORT, a relatively small subset or sample group of finished electronic devices may be selected by the manufacturer for testing over a period of time, such as several months. For DSD manufacturers, this can include, for example, operating a sample group of DSDs for several months while performing workloads, such as writing and reading data to simulate operation in the field. In some examples of ORT, the sample group of DSDs may be subjected to different environmental conditions, such as certain vibration and/or temperature conditions, or otherwise tested for reliability.

Although ORT may identify issues or problems that may be common to other manufactured DSDs, ORT can take a long time to detect such issues or problems. Many other DSDs may have already been shipped to DSD operators, such as a customer, before the issue or problem is detected through ORT. This delay can increase the cost and impact of the identified problem or issue since many DSDs that may be susceptible to the issue or problem could already be in operation by the DSD operator. The ORT may also not accurately reflect the actual workloads experienced by the DSDs for a particular DSD operator. This difference between the workloads used for ORT and the workloads actually performed in the field can further complicate the identification and/or handling of an issue or problem.

Furthermore, the identification of a cause or causes of an issue or problem can be difficult for relatively complex electronic devices that may include many components. For example, some types of DSDs, such as Hard Disk Drives (HDDs), include a wide variety of different electrical and mechanical components whose operation can depend on the interaction of the different types of components and/or firmware that controls operation of the DSD. Identifying which component or combination of components and/or portions of firmware that are responsible for a particular issue or problem detected during ORT can be challenging and time consuming.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

FIG. 3 is a flowchart for a virtual testing model construction process according to one or more embodiments.

FIG. 4 is a flowchart for a lower level DSD embedding process according to one or more embodiments.

FIG. 5 is a flowchart for a DSD component embedding process to represent a virtual DSD according to one or more embodiments.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Example System Environments

Figure 1:
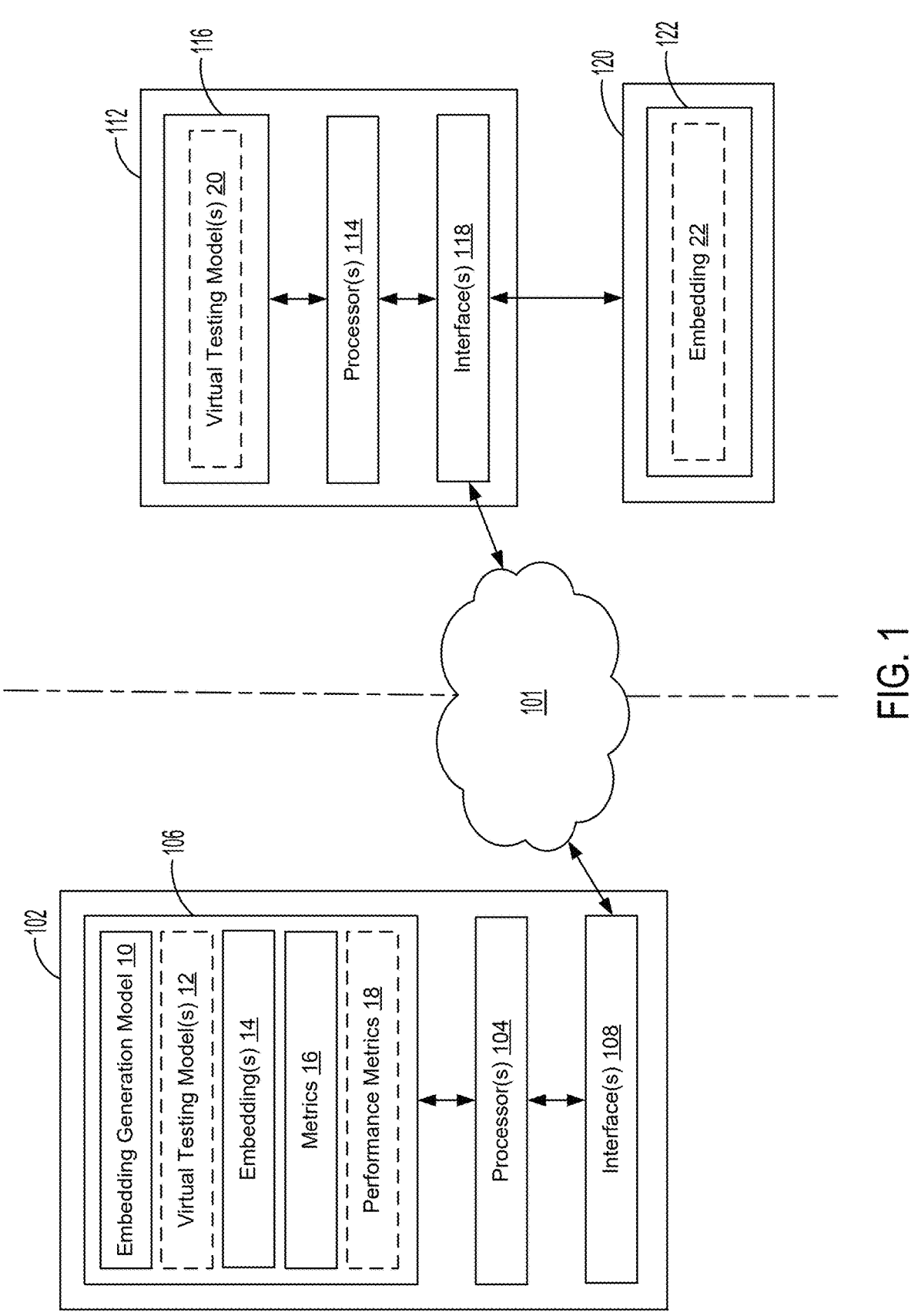
FIG. 1 is a block diagram of an example Data Storage Device (DSD) manufacturer system and an example DSD operator system according to one or more embodiments.

FIG. 1 is a block diagram of example Data Storage Device (DSD) manufacturer system 102 and example DSD operator system 112 according to one or more embodiments. In some implementations, manufacturer system 102 and/or DSD operator system 112 can include, for example, a computer system, such as a desktop, laptop, or server. The left half of FIG. 1 can represent a DSD manufacturer domain and the right half of FIG. 1 can represent a DSD operator domain, such as for a purchaser of DSDs from the DSD manufacturer. In this regard, DSD 120 in FIG. 1 can be a DSD made by the DSD manufacturer and purchased by the DSD operator.

In the example of FIG. 1, manufacturer system 102 and DSD operator system 112 communicate via network 101, which can include, for example, a Wide Area Network (WAN), such as the internet. In other examples, manufacturer system 102 and DSD operator system 112 may not directly communicate with each other via network 101. Instead, information such as one or more virtual testing models 20 may be provided from the DSD operator to the manufacturer via non-transitory computer-readable media or via another system. Virtual testing models can include, for example, Virtual Ongoing Reliability Testing (VORT) by a DSD manufacturer that may predict the future reliability of a DSD or virtual qualification or integration testing by a DSD operator that may predict suitability of a DSD for workloads of the DSD operator, or other virtual performance testing of a DSD or of a virtual DSD including particular DSD components. Virtual testing model(s) 20 are shown in a dashed box in FIG. 1 to indicate that they are optional.

In some implementations, the DSD manufacturer may provide information, such as embeddings representing DSDs sold to the DSD operator, by storing the embedding in a log file of the DSD that the embedding represents. This is shown as an option in FIG. 1 with embedding 22 shown as a dashed box stored in memory 122 of DSD 120. The DSD operator may then access embedding 22 using DSD operator system 112 to input into or otherwise use with one or more virtual testing models 20 that may simulate one or more DSD workloads for the DSD operator.

The virtual testing model(s) can, in some implementations, include Artificial Intelligence (AI) or Machine Learning (ML) models that simulate DSD workloads, such as the performance of a certain amount of write commands or read commands during a period of time, such as five years, without actually having to perform the commands or a particular DSD workload over such a timeframe. This virtual testing in some cases can shorten the time to find problems or issues with a DSD, its components and/or its firmware before it is shipped to the DSD operator.

An embedding representing a DSD can be tested virtually using one or more virtual testing models 12 executed by one or more processors 104 of manufacturer system 102. In some implementations, virtual testing model(s) 12 can simulate at least one DSD workload for one or more quality assurance tests of the DSD manufacturer. Alternatively or additionally, virtual testing model(s) 12 can simulate at least one workload of the DSD operator, which may be provided by the DSD operator to the manufacturer to identify, for example, DSDs that may be better suited to the DSD operator's expected usage of the DSD. Virtual testing model(s) 12 are shown in a dashed outline to indicate that the models may alternatively be executed at another device, such as with virtual testing model(s) 20 being executed at DSD operator system 12 or at another device, such as at a server for a cloud service.

Manufacturer system 102 includes one or more processors 104, one or more interfaces 108, and one or more memories 106. Processor(s) 104 can include, for example, circuitry such as one or more Central Processing Units (CPUs), Graphics Processing Units (GPUs), microcontrollers, Digital Signal Processors (DSPs), Application-Specific Integrated Circuits (ASICs), Field Programmable Gate Arrays (FPGAs), hard-wired logic, analog circuitry and/or a combination thereof. In some implementations, processor(s) 104 can include a System on a Chip (SoC) that may be combined with one or more memories 106 of manufacturer system 102 and/or interface(s) 108. In the example of FIG. 1, processor(s) 104 execute instructions, such as instructions from embedding generation model 10, virtual testing model(s) 12, an operating system of manufacturer system 102, or other applications executed by manufacturer system 102. One or more memories 106 of manufacturer system 102 can store data used by the applications executed by processor(s) 104, such as one or more embeddings 14, metrics 16, and optional performance metrics 18.

Memory or memories 106 can include, for example, flash memory, rotating magnetic disks, Dynamic Random Access Memory (DRAM), Static Random Access Memory (SRAM), Magnetoresistive RAM (MRAM), other type of Storage Class Memory (SCM), or other type of solid-state memory. In the example of FIG. 1, memory or memories 106 store embedding generation model 10 or portions thereof, in addition to optionally storing one or more virtual testing models 12. One or both of these models can include AI models or ML models in some implementations. In addition, in the example of FIG. 1, memory or memories 106 store one or more embeddings 14, metrics 16, and optionally, performance metrics 18.

While the description herein refers to solid-state memory generally, it is understood that solid-state memory may comprise one or more of various types of memory devices such as flash integrated circuits, NAND memory (e.g., Single-Level Cell (SLC) memory, Multi-Level Cell (MLC) memory (i.e., two or more levels), or any combination thereof), NOR memory, EEPROM, Chalcogenide RAM (C-RAM), Phase Change Memory (PCM), Programmable Metallization Cell RAM (PMC-RAM or PMCm), Ovonic Unified Memory (OUM), Resistive RAM (RRAM), Ferroelectric Memory (FeRAM), MRAM, 3D-XPoint memory, and/or other discrete Non-Volatile Memory (NVM) chips, or any combination thereof.

Embedding(s) 14 can represent one or more corresponding DSDs that have been encoded by embedding generation model 10 using metrics 16. Each embedding can represent an actual DSD that has been assembled or manufactured by the manufacturer or may represent a virtual DSD that has yet to be built by using metrics obtained for one or more DSD components. In some cases, metrics 16 can be transformed using embedding generation model 10 into mathematical vector embeddings of a high dimension (e.g., having many parameters) to represent the information obtained or determined for one or more DSD components or for a completed DSD.

In some implementations, embedding(s) 14 can be stored in a vector database with vector metadata, which may be included in a vector index and/or metadata index for the vector database to enable efficient searching of the vector database. In testing a DSD or a to-be-completed virtual DSD, virtual testing model(s) can, in some implementations, find groups of embedding(s) in a vector space representing DSDs that may be better suited to particular simulated workloads than other DSDs represented by other corresponding embeddings outside of a localized area in the vector space. The identification of groupings or clusters of DSD representations (i.e., embeddings) that may have similar features or a similar predicted performance for a given DSD workload can involve, for example, performing an Approximate Nearest Neighbor (ANN) search with operations such as determining a cosine of an angle between vector embeddings, a Euclidian distance between vector embeddings, or a dot product between vector embeddings to identify similar embeddings and return a certain number of nearest or most similar embeddings with respect to particular performance criteria.

Metrics 16 can be stored in a data structure that can be organized or sorted by particular DSDs or by particular DSD components that are measured or tested to determine the metrics. In the case of a Hard Disk Drive (HDD) or Solid-State Hybrid Drive (SSHD) that includes a rotating magnetic disk for storing data, metrics 16 can include, for example, at least one of a Magnetic Core Width (MCW) of one or more heads of a DSD or to-be-completed DSD (i.e., a virtual DSD), a Tracks Per Inch (TPI) setting of one or more disk surfaces of a DSD or to-be-completed DSD, a Bits Per Inch (BPI) setting of the one or more disk surfaces of the DSD or to-be-completed DSD, a Symbol Error Rate (SER) for the one or more heads reading data from the one or more disk surfaces of the DSD or to-be-completed DSD, a loading or unloading characteristic for actuating the one or more heads onto or from a ramp near the one or more disk surfaces of the DSD or to-be-completed DSD, a fly height setting for floating the one or more heads over the one or more disk surfaces of the DSD or to-be-completed DSD, and a Position Error Signal (PES) characteristic for positioning the one or more heads over the one or more disk surfaces of the DSD or to-be-completed DSD. In some cases, metrics 16 may also include information about the DSD or component, such as a supplier or manufacturer of a component, a particular quality of the component (e.g., a higher specification component), and/or a product type of the DSD or a product type that the component will be used in (e.g., an HDD with twelve heads versus an HDD with ten heads). Those of ordinary skill in the art will appreciate with reference to the present disclosure that many other metrics can be obtained or determined for an HDD or for other types of DSDs or electronic devices that may store data, such as for a Solid-State Drive (SSD).

Performance metrics 18 can differ from metrics 16 in that performance metrics 18 can be obtained or determined from Ongoing Reliability Testing (ORT) of DSDs that may be tested by the manufacturer or by the DSD operator. The ORT may take place over a period of time such as four months or a year, for example. Performance metrics 18 can include, for example, at least one of an error rate in storing or retrieving data in the DSD, an indication of a latency in performing commands to store or retrieve data in the DSD, and an indication of usable storage capacity of the DSD. These performance metrics obtained by testing DSDs can be used to construct virtual testing model(s) 12 and/or virtual testing model(s) 20, which can include an AI or ML model that is trained based on the performance metrics 18.

Manufacturer system 102 can communicate with DSD operator system 112 via network 101 using one or more interfaces 108. Network 101 can include, for example, a Local Area Network (LAN) or a WAN, such as the internet or another type of network. In this regard, interface(s) 108 can include a network interface card in some implementations.

As shown in FIG. 1, DSD operator system 112 includes one or more memories 116, one or more processors 114, and one or more interfaces 118. Processor(s) 114 can include, for example, circuitry such as one or more CPUs, GPUs, microcontrollers, DSPs, ASICs, FPGAs, hard-wired logic, analog circuitry and/or a combination thereof. In some implementations, processor(s) 114 can include an SoC that may be combined with one or more memories 116 of DSD operator system 112 and/or interface(s) 118. In the example of FIG. 1, processor(s) 114 execute instructions, such as instructions from virtual testing model(s) 20, an operating system of DSD operator system 112, or other applications executed by DSD operator system 112. One or more memories 116 of DSD operator system 112 can store data used by the applications executed by processor(s) 114, such as one or more embeddings representing one or more DSDs and performance metrics that may have been obtained by the DSD operator by performing ORT of DSDs.

Memory or memories 116 can include, for example, flash memory, rotating magnetic disks, DRAM, SRAM, MRAM, other type of SCM, or other type of solid-state memory. In the example of FIG. 1, memory or memories 116 optionally store one or more virtual testing models 20 that can simulate one more DSD workloads of the DSD operator. In some implementations, virtual testing model(s) 20 can include one or more AI models or ML models.

Interface(s) 118 are used by DSD operator system 112 to communicate with network 101 and with DSD 120. In this regard, interface(s) 118 can communicate with DSD 120 via a bus or a network, which can include, for example, a Compute Express Link (CXL) bus, a Peripheral Component Interconnect express (PCIe) bus, a LAN, or a WAN, such as the internet or another type of bus or network. In this regard, interface(s) 118 can include a network interface card in some implementations. In some examples, DSD operator system 112 can include software for controlling communication with DSD 120, such as a device driver of an operating system of DSD operator system 112. As noted above, DSD operator system 112 may access embedding 22, which represents DSD 120. Embedding 22 may then be provided as an input to virtual testing model(s) 20 to determine whether there may be any predicted issues or problems with DSD 120 in performing a certain DSD workload or workloads simulated by virtual testing model(s) 20. This can provide the DSD operator with a way of testing or integrating a new DSD, for example, before actually putting it into normal use, or at an earlier stage in its normal use, to predict if the DSD may have any issues or problems later on.

Those of ordinary skill in the art will appreciate with reference to the present disclosure that other implementations of a DSD manufacturer system and a DSD operator system for performing virtual testing of DSDs may differ. For example, a virtual testing model may instead be executed on a different system, such as at a cloud server, using an embedding for a DSD or virtual DSD to be built by the manufacturer. As another example variation, one or all of metrics 16, embeddings 14, and performance metrics 18 may be stored in a different system or memory, such as in a remote cloud storage accessed by the manufacturer. In addition, and as discussed above, the embeddings for the DSDs may not be stored in a memory of the corresponding DSD but may instead be provided separately from the DSD to the DSD operator for virtual testing. In yet other implementations, the embeddings for the DSDs may not even be provided to the DSD operator but may instead be used entirely by the DSD manufacturer for in-house testing or sorting purposes that may or may not be based on simulated workloads of a particular DSD operator.

Example Processes

Figure 2:
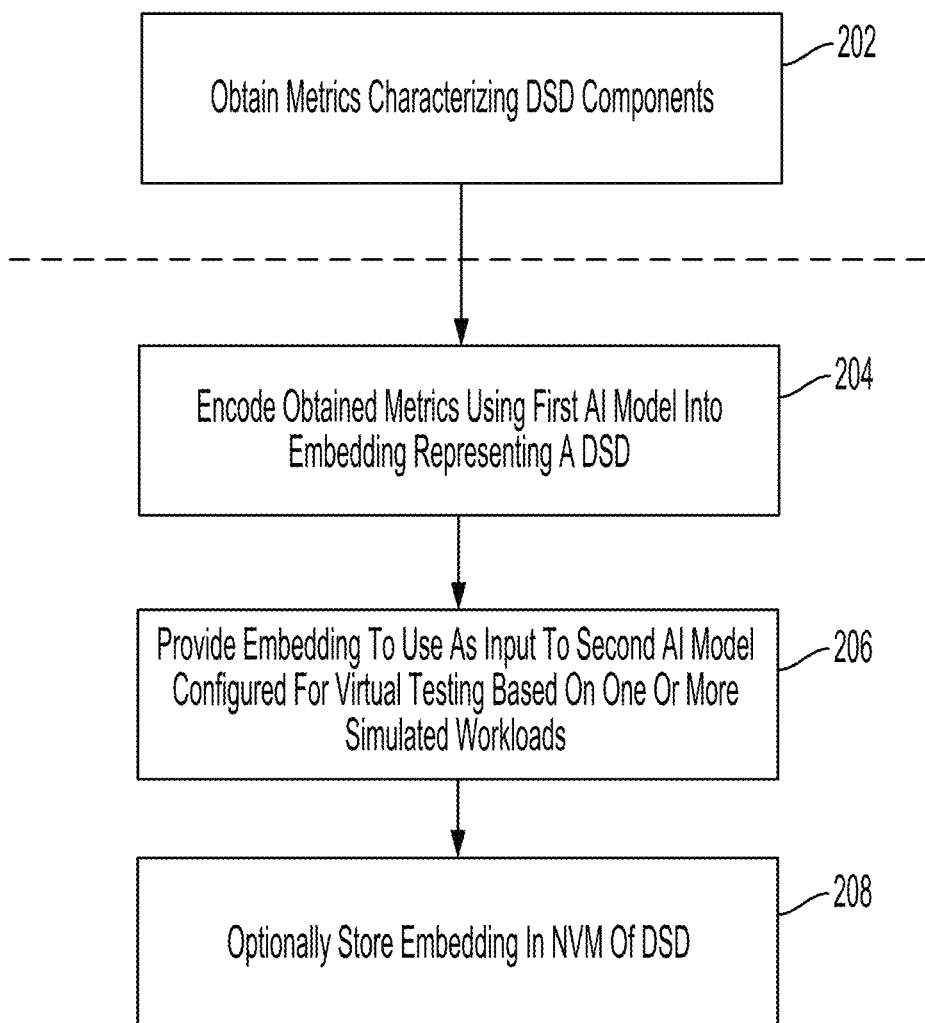
FIG. 2 is a flowchart for a DSD embedding process to represent a DSD according to one or more embodiments.

FIG. 2 is a flowchart for a DSD embedding process according to one or more embodiments. The process of FIG. 2 can be performed by, for example, one or more processors 104 of manufacturer system 102 executing embedding generation model 10 and virtual testing model(s) 12 in FIG. 1. Alternatively, the virtual testing model or models may be executed by one or more processors 114 of DSD operator system 112 executing virtual testing model(s) 20 in the example of FIG. 1. In this regard, processor(s) 104, or a combination of processor(s) 104 and processor(s) 114 can, in some implementations, comprise a means for performing the functions of the DSD embedding process of FIG. 2.

In block 202, the processor(s) obtain metrics that characterize DSD components, such as one or more magnetic disks used in an HDD, heads used to read or write data on such a magnetic disk, and/or mechanical components, such as motors or actuator assemblies used to position a head over a magnetic disk, for example. In other implementations, the DSD components could be for a different type of DSD, such as an SSD, and the obtained metrics can characterize, for example, a flash die and/or different voltage settings used to program or erase one or more blocks in the flash die.

In the case of an HDD, the obtained metrics can include, for example, at least one of an MCW of one or more heads, a TPI setting of one or more disk surfaces, a BPI setting of the one or more disk surfaces, an SER for the one or more heads when reading data, a loading or unloading characteristic for actuating the one or more heads onto or from a ramp, a fly height setting for floating the one or more heads over the one or more disk surfaces, and a PES characteristic for positioning the one or more heads over the one or more disk surfaces. In this regard, the obtained metrics can represent the interaction of multiple components of the DSD. For example, The TPI setting or BPI setting can represent an interaction between qualities of the head (e.g., a Magnetic Erase Width (MEW) of the head) and the disk surface (e.g., a Write Erase Width (WEW) representing varying magnetic coercivity of the disk surface). Other metrics such as a type of the DSD (e.g., model or other specification of the DSD) may also be included in the obtained metrics.

The metrics may be determined or measured during the manufacture or assembly of the DSD by testing the components or otherwise measuring their performance and/or physical attributes. In some implementations, the metrics can be compiled for the components over a period time while the DSD is being manufactured and then provided to the processor(s). The number of components measured or tested to obtain the metrics can vary in different implementations for representing the DSD. In some implementations, the DSD may be represented with metrics for most of the components of the DSD. In other implementations, the DSD may be represented using metrics for only a few components of the DSD. In this regard, the more metrics that are used for generating an embedding, the more accurately the performance of the DSD can be predicted using virtual testing.

In block 204, the obtained metrics are encoded into an embedding representing a DSD using a first AI model (e.g., embedding generation model 10 in FIG. 1). The embedding can include a mathematical vector embedding of a high dimension to represent a DSD using the obtained metrics. The dashed line between blocks 202 and 204 in FIG. 2 indicates that the metrics obtained in block 202 may occur well-before, or at a different time than, the encoding of the metrics into the embedding. For example, the metrics may be obtained over a period of weeks as the components are manufactured and tested at different stages in the assembly of the DSD.

In block 206, the embedding is provided as an input to a second AI model configured for virtual testing based on one or more simulated workloads (e.g., a virtual testing model 12 or 20 in FIG. 1). The use of the embedding as an input to the virtual testing model can provide a more complete picture of possible interactions between DSD components, firmware of the DSD, and/or the simulated DSD workloads, as compared to only providing the metrics to the virtual testing model. In addition, and as discussed in more detail below with reference to FIGS. 4 and 5, using embeddings as inputs to the virtual testing model can enable predictions on how a to-be-assembled DSD will perform at different stages of its assembly based on the metrics for one or more components of the DSD obtained at the different stages. As more metrics are encoded to update the embedding or to better approximate a final embedding for the DSD, the predictions on how the DSD will perform based on the virtual testing model can become more accurate.

In some implementations, the embedding representing the DSD can be provided to a DSD operator (e.g., a purchaser of the DSD) from the DSD manufacturer who created the embedding for the DSD operator to virtually test the DSD using their own virtual testing model based on one or more of their own workloads. By providing an embedding to the DSD operator, as opposed to providing the underlying metrics or a subset of the metrics, the DSD manufacturer can keep certain details or metrics about the DSD confidential, while still providing a more complete representation of the specific DSD provided to the DSD operator as compared to only providing a limited set of metrics.

In other implementations, the DSD manufacturer may use a virtual testing model to virtually test a DSD for a particular DSD operator's (e.g., a particular customer's) workload. In some cases, this can enable the manufacturer to determine before shipping the DSD to a particular DSD operator whether the DSD is likely to meet a certain specification or perform well for the DSD operator's particular usage. In this regard, the DSD manufacturer may use the virtual testing to identify DSDs that may be better suited for one customer than for another customer, and in some implementations, sort DSDs for different customers based on the results of the virtual testing.

In some implementations, the virtual testing model may be provided to the DSD manufacturer by the DSD operator. By providing a virtual testing model to the DSD manufacturer, as opposed to providing the underlying DSD workloads, the DSD operator can keep certain details about their workloads confidential, while still providing the DSD manufacturer with virtual testing capability that is specific to the DSD operator.

In block 208, the embedding is optionally stored in an NVM of the DSD. For example, the DSD manufacturer may store an embedding generated for a DSD in its NVM as part of a log where the DSD operator may access the embedding to use for testing, such as with a virtual testing model of the DSD operator. In other implementations, the DSD manufacturer may separately provide the embedding to the DSD operator, such as by sending the embedding via a network or providing a separate computer-readable medium (e.g., a flash drive) for the DSD operator to access the embedding. In yet other implementations, block 208 may be omitted, such as in implementations where the DSD manufacturer performs its own virtual testing in block 206, without providing the embedding to the DSD operator.

Those of ordinary skill in the art will appreciate with reference to the present disclosure that other implementations of the DSD embedding process of FIG. 2 may differ. For example, those of ordinary skill in the art will appreciate that there are numerous other metrics that can be obtained for a DSD than the examples provided above for block 202. As another example variation, other implementations may not store the embedding in an NVM of the DSD as in block 208. As yet another example variation, blocks 202 and 204 may be performed for multiple DSDs that are to be included in a storage system, such as a storage server. The embeddings for the different DSDs may then be used to determine a system embedding, such as by averaging the values for the individual DSD embeddings. The system embedding may then be provided to the second AI model in block 206 for virtual testing.

FIG. 3 is a flowchart for a virtual testing model construction process according to one or more embodiments. The process of FIG. 3 can be performed by, for example, one or more processors 104 of manufacturer system 102 in FIG. 1 using performance metrics 18. In this regard, processor(s) 104 can, in some implementations, comprise a means for performing the functions of the virtual testing model construction process of FIG. 3. The process of FIG. 3 may be used to create a new model for virtual testing or to update an existing virtual testing model.

In block 302, performance metrics are obtained for constructing a second AI model that virtually tests DSDs. The performance metrics can indicate, for example, at least one of an error rate in storing or retrieving data from a DSD (e.g., a bit error rate when reading data, an average number of read retries, or an average number of write retries), an indication of a latency in performing commands to store or retrieve data (e.g., an average command queue length, a number of timeouts for performing a command, or an Input/Output Operations Per Second (IOPS) metric for the DSD), and an indication of a usable storage capacity (e.g., an average storage capacity per disk surface or a number of mapped out or defective storage locations).

In some cases, first performance metrics can be determined by the DSD manufacturer during testing, such as during ORT of a first plurality or set of DSDs manufactured by the DSD manufacturer. In other cases, second performance metrics can be received by the DSD manufacturer for a second plurality or set of DSDs that may already be operating in the field for one or more DSD operators. In such cases, the second plurality of DSDs may provide the performance metrics to the DSD manufacturer as an automated background activity via a network and/or the DSD operator may otherwise provide the performance metrics to the DSD manufacturer to improve its DSDs or better tailor its DSDs for the DSD operator. In some implementations, the performance metrics used to construct or update the second AI model can include both performance metrics determined by the manufacturer and performance metrics received from DSDs operating in the field for one or more DSD operators.

In block 304, the second AI model is constructed or updated based at least in part on at least one of the determined first performance metrics and the received second performance metrics. The performance metrics can be used to train the second AI model and may consider different metrics obtained for the first plurality and/or second plurality of DSDs in determining the relative importance of the different metrics in relation to the performance metrics measured or determined in the field or during ORT. The training can include clustering or similarly weighting different embedding vectors for different DSDs that have similar performance metrics with respect to one or more performance metrics so that the similarly performing DSDs are in closer proximity to each other in a vector space. The second AI model can be used, as discussed above, to virtually test a DSD or to virtually test a virtual DSD including one or more components for a to-be-completed DSD.

Those of ordinary skill in the art will appreciate with reference to the present disclosure that other implementations of the virtual testing model construction process of FIG. 3 may differ. For example, blocks 302 and 304 may be performed repeatedly to fine-tune or adjust the second AI model with different sets of performance metrics, such as at different points during a manufacturer's ORT or if using performance metrics received from different DSD operators.

FIG. 4 is a flowchart for a lower level DSD embedding process according to one or more embodiments. The process of FIG. 4 can be performed by, for example, one or more processors 104 of DSD manufacturer system 102 in FIG. 1 executing DSD embedding generation model 10. In this regard, processor(s) 104 can, in some implementations, comprise a means for performing the functions of the lower level DSD embedding process of FIG. 4.

In block 402, at least one metric is obtained for components of a DSD that is a subset of a full set of metrics used to encode an embedding for the DSD or for another DSD. In some cases, the at least one metric may be for a particular component or related set of components that are being used to create a first level embedding representing a DSD with a lower level of specificity than may otherwise be provided with a higher level embedding that is encoded from a greater number of metrics for the DSD. The lower level embedding or approximated embedding may be provided to a DSD operator, for example, with the DSD, while a higher level or more accurate embedding may be provided to the DSD operator as an add-on option that may be used for a more detailed representation of the DSD that may provide better predictions of actual performance.

In other cases, the lower-level embedding may be used during the manufacture or assembly of the DSD to perform VORT and determine whether one or more components of a to-be-completed DSD are well suited for a particular DSD operator or particular DSD workloads. In some implementations, the DSD manufacturer may sort the component or components for different DSD operators based on such virtual testing with a lower-level embedding.

In block 404, the at least one metric is encoded using the first AI model to represent the DSD as a first level embedding at a lower level of specificity. As discussed above, the first AI model can transform one or more metrics for the DSD component(s) into a representation of a virtual DSD or of the actual DSD that includes the component(s) for use with a second AI model that provides virtual testing. Advantageously, an embedding representing a DSD can be generated using any number of metrics to enable different levels of embeddings. This can allow for virtual testing of components or DSDs that may not have a full set of metrics determined for all or most of its components that are typically used to generate a full or higher-level embedding.

Those of ordinary skill in the art will appreciate with reference to the present disclosure that other implementations of the lower level DSD embedding process of FIG. 4 may differ. For example, in some implementations, blocks 402 and 404 may be performed iteratively during the production of a DSD to virtually test a to-be-completed DSD at different stages of production. This can provide a growing sense of the predicted performance of the DSD before it is built.

FIG. 5 is a flowchart for a DSD component embedding process according to one or more embodiments. The component embedding process of FIG. 5 differs from the DSD embedding process of FIG. 2 in that the embedding process of FIG. 5 may be used by a manufacturer as a DSD is being assembled to determine which components should be used in a to-be-completed DSD.

The process of FIG. 5 can be performed by, for example, one or more processors 104 of DSD manufacturer system 102 in FIG. 1 executing DSD embedding generation model 10 and virtual testing model(s) 12. Alternatively, the virtual testing model or models may be executed by one or more processors 114 of DSD operator system 112 executing virtual testing model(s) 20 in the example of FIG. 1. In this regard, processor(s) 104, or a combination of processor(s) 104 and processor(s) 114 can, in some implementations, comprise a means for performing the functions of the DSD component embedding process of FIG. 5.

In block 502, the processor(s) obtain metrics that characterize at least one DSD component, such as one or more magnetic disks used in an HDD, one or more heads used to read or write data on such a magnetic disk, and/or mechanical components, such as one or more motors or actuator assemblies used to position a head over a magnetic disk, for example. In other implementations, the DSD components could be for a different type of DSD, such as for an SSD, and the obtained metrics can characterize, for example, a flash storage medium (e.g., a block, die, or plane) or circuitry used to read or write data in the flash storage medium.

In the case of an HDD, the obtained metrics can include, for example, at least one of an MCW of one or more heads, a TPI setting of one or more disk surfaces, a BPI setting of the one or more disk surfaces, an SER for the one or more heads when reading data, a loading or unloading characteristic for actuating the one or more heads onto or from a ramp, a fly height setting for floating the one or more heads over the one or more disk surfaces, and a PES characteristic for positioning the one or more heads over the one or more disk surfaces. Other metrics such as a supplier or manufacturing location for the component(s), a quality level of the component(s), or a type of DSD that the component(s) are to be used in may also be included in the obtained metrics.

The metrics may be determined or measured during the manufacture or assembly of the DSD by testing the components or otherwise measuring their performance and/or physical attributes. In some implementations, the metrics can be compiled for the components during testing of the individual components and later provided to the processor(s). The metrics can come from testing or measuring a single component or may come from testing or measuring multiple components.

In block 504, the obtained metrics are encoded using a first AI model (e.g., embedding generation model 10 in FIG. 1) into an embedding representing a virtual DSD that includes the at least one DSD component. The embedding can include a mathematical vector embedding to represent the obtained metric or metrics. The dashed line between blocks 502 and 504 in FIG. 5 indicates that the metric or metrics obtained in block 502 may occur at a different time or over a relatively long period of time as compared to the encoding of the metric or metrics into the embedding in block 504.

In block 506, the embedding is provided as an input to a second AI model configured for virtual testing based on one or more simulated workloads (e.g., a DSD virtual testing model 12 or 20 in FIG. 1). In some implementations, the DSD manufacturer may use a virtual testing model to test the virtual DSD represented by the embedding including the component or components for a particular DSD operator's (e.g., a particular customer's) simulated workload. In other implementations, the DSD manufacturer may use a virtual testing model to test the virtual DSD represented by the embedding as part of its own quality control process to determine whether the at least one component is likely to perform well or not fail within a predetermined time of operation.

In block 508, it is determined whether to use the at least one DSD component in a to-be-completed DSD. In some cases, this can enable the manufacturer to determine before completing assembly of a DSD whether to include the component or components in a to-be-built DSD for the DSD operator. In this regard, the DSD manufacturer may use the virtual testing to identify DSD components that may be better suited for one customer than for another customer. In addition, the results of the virtual testing are determined much quicker than performing actual testing, such as ORT, which may take several months. This can provide much more effective quality control by identifying components that should not be used before they are integrated in the DSD.

Those of ordinary skill in the art will appreciate with reference to the present disclosure that other implementations of the DSD component embedding process of FIG. 5 may differ. For example, those of ordinary skill in the art will appreciate that there are numerous other metrics that can be obtained for a DSD than the examples provided above for block 502. As another example variation, other implementations of the process of FIG. 5 may only perform block 508 for determining whether the at least one DSD component meets performance criteria for quality control, as opposed to determining the suitability of the at least one DSD component for a particular DSD operator.

As discussed above, the foregoing systems and processes for virtually testing DSDs can catch problems or issues before the shipment of DSDs by shortening the time needed to identify problems or potential issues. In addition, particular components that may later create a problem or issue for a to-be-completed DSD can be identified during the manufacturing process before being fully integrated into the DSD, thereby saving time and possibly preventing a waste of materials that would have otherwise been used in assembling the DSD with such components. The use of embeddings to represent DSDs or virtual DSDs can also provide a better and more holistic identification of potential problems or issues that may otherwise be missed by focusing on testing only one or a few DSD components in isolation.

The foregoing systems and processes for virtual testing can also be better tailored to the actual workloads and operating conditions of DSD operators, who may provide or use their own virtual testing models and/or operational performance metrics to the manufacturer. This can enable, for example, the sorting or selection of DSDs, or even particular DSD components, for a DSD operator.

Other Embodiments

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes processor or controller circuitry to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, processor circuitry, and controller circuitry described in connection with the examples disclosed herein may be implemented or performed with a general purpose processor, a GPU, a DSP, an ASIC, an FPGA or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. Processor or controller circuitry may also be implemented as a combination of computing devices, e.g., a combination of a DSP and a microprocessor, a plurality of microprocessors, an SoC, one or more microprocessors in conjunction with a DSP core, or any other such configuration.

The activities of a method or process described in connection with the examples disclosed herein may be embodied directly in hardware, in a software module executed by processor or controller circuitry, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to processor or controller circuitry such that the processor or controller circuitry can read information from, and write information to, the storage medium. In the alternative, the storage medium may be integral to processor or controller circuitry. The processor or controller circuitry and the storage medium may reside in an ASIC or an SoC.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive. In addition, the use of language in the form of "at least one of A and B" in the following claims should be understood to mean "only A, only B, or both A and B."

What is claimed is:

1. A method of representing a Data Storage Device (DSD) for virtual testing, the method comprising:

obtaining a plurality of metrics that characterize components of the DSD;

encoding, by a DSD manufacturer system using a first Artificial Intelligence (AI) model, the plurality of obtained metrics into an embedding representing the DSD; and providing the embedding to use as an input to a second AI model configured for virtual testing by a DSD operator system based on one or more simulated DSD workloads, wherein the DSD operator system is separately owned from the DSD manufacturer system and at least one of:

the one or more simulated DSD workloads are kept confidential from the DSD manufacturer system; and at least one of the plurality of obtained metrics is kept confidential from the DSD operator system.

2. The method of claim 1, wherein the plurality of metrics includes at least one of a Magnetic Core Width (MCW) of one or more heads of the DSD, a Tracks Per Inch (TPI) setting of one or more disk surfaces of the DSD, a Bits Per Inch (BPI) setting of the one or more disk surfaces of the DSD, a Symbol Error Rate (SER) for the one or more heads reading data from the one or more disk surfaces, a loading or unloading characteristic for actuating the one or more heads onto or from a ramp near the one or more disk surfaces, a fly height setting for floating the one or more heads over the one or more disk surfaces, and a Position Error Signal (PES) characteristic for positioning the one or more heads over the one or more disk surfaces.

3. The method of claim 1, further comprising:

performing at least one of: determining first performance metrics for a first plurality of DSDs based on Ongoing Reliability Testing (ORT) of the first plurality of DSDs; and receiving second performance metrics for a second plurality of DSDs from at least one DSD operator; and constructing or updating the second AI model based at least in part on at least one of the determined first performance metrics and the received second performance metrics.

4. The method of claim 3, wherein the first performance metrics and the second performance metrics include at least one of an indication of an error rate in storing or retrieving data, an indication of a latency in performing commands to store or retrieve data, and an indication of a usable storage capacity.

5. The method of claim 1, further comprising providing the embedding to a DSD operator that purchases the DSD and owns the DSD operator system.

6. The method of claim 5, wherein the embedding is provided to the DSD operator separately from the DSD.

7. The method of claim 1, further comprising storing the embedding in a non-volatile memory of the DSD for access by a DSD operator of the DSD.

8. The method of claim 1, wherein the second AI model simulates at least one workload of a DSD operator of the DSD.

9. The method of claim 1, further comprising providing the embedding to the DSD operator system via a network.

10. The method of claim 1, further comprising:

obtaining at least one metric for the components of the DSD wherein the at least one metric is a subset of metrics used for the plurality of metrics; and encoding, using the first AI model, the at least one metric into a first level embedding representing the DSD at a lower level of specificity as compared to the embedding for the DSD.

11. The method of claim 1, further comprising:

obtaining at least one metric for a component to be used in a virtual DSD, wherein the at least one metric is a subset of metrics used for the plurality of metrics;

encoding, using the first AI model, the at least one metric into a first embedding representing the virtual DSD;

using the first embedding as a first input to the second AI model, wherein the second AI model is configured for virtual testing based on at least one simulated DSD workload of a DSD operator of the DSD; and based at least in part on an output of the second AI model, determining whether to use the component in a to-be-completed DSD for the DSD operator.

12. The method of claim 1, further comprising determining a system embedding for a system including a plurality of DSDs based on embeddings for each DSD of the plurality of DSDs.

13. A method of performing virtual testing for at least one Data Storage Device (DSD) component, the method comprising:

obtaining at least one metric characterizing the at least one DSD component;

storing the at least one metric in a memory of a DSD manufacturer system;

providing the at least one metric to a first Artificial Intelligence (AI) model executed, individually or in combination, by one or more processors of the DSD manufacturer system;

encoding, using the first AI model, the at least one metric into an embedding representing a to-be-completed DSD including the at least one DSD component; and providing the embedding as an input to a second AI model configured for virtual testing of the to-be-completed DSD based on one or more simulated DSD workloads.

14. The method of claim 13, wherein the second AI model simulates at least one workload for one or more quality assurance tests of a DSD manufacturer.

15. The method of claim 13, wherein the second AI model simulates at least one workload of a DSD operator.

16. The method of claim 15, further comprising, based at least in part on an output of the second AI model, determining whether to use the at least one DSD component in the to-be-completed DSD.

17. The method of claim 13, wherein the at least one DSD metric includes one or more of a Magnetic Core Width (MCW) of one or more heads of a DSD, a Tracks Per Inch (TPI) setting of one or more disk surfaces of the DSD, a Bits Per Inch (BPI) setting of the one or more disk surfaces of the DSD, a Symbol Error Rate (SER) for the one or more heads reading data from the one or more disk surfaces, a loading or unloading characteristic for actuating the one or more heads onto or from a ramp near the one or more disk surfaces, a fly height setting for floating the one or more heads over the one or more disk surfaces, and a Position Error Signal (PES) characteristic for positioning the one or more heads over the one or more disk surfaces.

18. The method of claim 13, further comprising:
performing at least one of:
    determining first performance metrics for a first plu-
        rality of DSDs based on Ongoing Reliability Testing
        (ORT) of the first plurality of DSDs; and
    receiving second performance metrics for a second
        plurality of DSDs from at least one DSD operator;
        and
    constructing or updating the second AI model based at
        least in part on at least one of the determined first
        performance metrics and the received second perfor-
        mance metrics.

19. The method of claim 18, wherein the first performance
metrics and the second performance metrics include at least
one of an indication of an error rate in storing or retrieving
data, an indication of a latency in performing commands to
store or retrieve data, and an indication of a usable storage
capacity.

20. A non-transitory computer readable medium storing
computer-executable instructions, wherein when the computer-executable instructions are executed by one or more
processors of a Data Storage Device (DSD) manufacturer
system, the computer-executable instructions cause the one
or more processors, individually or in combination, to:
    receive a plurality of metrics for components of a DSD;
        and
    encode, using a first Artificial Intelligence (AI) model, the
        plurality of received metrics into an embedding repre-
        senting the DSD; and
    wherein the embedding is configured as an input to a
        second AI model to perform virtual testing of the DSD
        by a DSD operator system based on one or more
        simulated DSD workloads, and wherein the DSD
        operator system is separately owned from the DSD
        manufacturer system and at least one of:
        the one or more simulated DSD workloads are kept
            confidential from the DSD manufacturer system; and
        at least one of the plurality of received metrics is kept
            confidential from the DSD operator system.

* * * * *